United States Patent
Yin et al.

(10) Patent No.: US 8,299,950 B2
(45) Date of Patent: Oct. 30, 2012

(54) PIPELINED RECYCLING ADC WITH SHARED OPERATIONAL AMPLIFIER FUNCTION

(75) Inventors: Ping-Hung Yin, Grand Cayman (KY); Shih-Feng Chen, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 57 days.

(21) Appl. No.: 13/008,361

(22) Filed: Jan. 18, 2011

(65) Prior Publication Data

US 2012/0182170 A1    Jul. 19, 2012

(51) Int. Cl.
    *H03M 1/38* (2006.01)
(52) U.S. Cl. ........ 341/161; 341/118; 341/120; 341/155; 341/162
(58) Field of Classification Search .................. 341/118, 341/120, 155, 161, 162
    See application file for complete search history.

(56) References Cited

U.S. PATENT DOCUMENTS

| | | | | |
|---|---|---|---|---|
| 7,471,228 B2* | 12/2008 | Cho et al. | ...... | 341/162 |
| 7,561,095 B2* | 7/2009 | Sasaki et al. | ...... | 341/161 |
| 7,612,700 B2* | 11/2009 | Kawahito et al. | ...... | 341/161 |
| 7,612,701 B2* | 11/2009 | Cho et al. | ...... | 341/161 |
| 7,768,438 B1* | 8/2010 | Cho | ...... | 341/172 |
| 7,924,204 B2* | 4/2011 | Chang et al. | ...... | 341/161 |
| 2005/0104762 A1* | 5/2005 | Dias | ...... | 341/161 |
| 2006/0114143 A1* | 6/2006 | Dias | ...... | 341/155 |
| 2006/0125674 A1* | 6/2006 | Tadeparthy et al. | ...... | 341/155 |
| 2007/0090987 A1* | 4/2007 | Cho et al. | ...... | 341/161 |

* cited by examiner

*Primary Examiner* — Linh Nguyen
(74) *Attorney, Agent, or Firm* — Thomas|Kayden

(57) ABSTRACT

A pipelined recycling analog-to-digital converter (ADC), which converts a first analog input signal into a first digital output signal, including a first conversion stage and a second conversion stage is disclosed. The first conversion stage includes a first processing unit and a second processing unit. The first and the second processing units execute a number of conversion operations. For each conversion operation, an analog value and a digital code are generated by the first or the second processing unit. The first and the second processing units share an operational amplifier, and for each conversion operation. The second conversion stage includes a comparing unit which determines a specific analog value among the analog values generated by the first and the second processing units. When the specific analog value is not located within a predetermined range, the comparing unit generates a reset pulse to reset the operational amplifier.

15 Claims, 2 Drawing Sheets

PIPELINED RECYCLING ADC WITH SHARED OPERATIONAL AMPLIFIER FUNCTION

BACKGROUND OF THE INVENTION

1. Field of the Invention

The invention relates to a pipelined recycling ADC and more particularly to a pipelined recycling ADC with a shared operational amplifier (OP) function.

2. Description of the Related Art

Analog-to-digital converters (ADCs) are employed in a variety of electronic systems including computer modems, wireless telephones, satellite receivers, process control systems, etc. Such systems demand cost-effective ADCs that can efficiently convert an analog input signal to a digital output signal over a wide range of frequencies and signal magnitudes with minimal noise and distortion.

Among the variety of known ADC structures, flash ADCs, folding ADCs, subranging ADCs, and pipelined ADCs are all able to process signals at a high-speed. Of these various structures, the pipelined ADC structure, which is low powered and occupies a small area, has been widely used to satisfy both conditional requirements of high-speed signal processing and high resolution.

Generally, the pipelined ADC structure comprises serial conversion stages. To reduce power consumption, the conversion stages share an operational amplifier (OP). Since the OP is shared among the conversion stages, memory effect occurs during the conversion stages of a pipelined ADC. The efficiency of the pipelined ADC may be influenced by memory effect.

BRIEF SUMMARY OF THE INVENTION

An exemplary embodiment of a pipelined recycling analog-to-digital converter (ADC), which converts a first analog input signal into a first digital output signal, comprises a first conversion stage and a second conversion stage. The first conversion stage comprises a first processing unit and a second processing unit. The first and the second processing units execute a number of conversion operations. For each conversion operation, an analog value and a digital code are generated by the first or the second processing unit. The first and the second processing units share an operational amplifier, and for each conversion operation. The second conversion stage comprises a comparing unit which determines a specific analog value among the analog values generated by the first and the second processing units. When the specific analog value is not located within a predetermined range, the comparing unit generates a reset pulse to reset the operational amplifier.

An exemplary embodiment of a pipelined recycling ADC converts an analog input signal into a digital output signal and comprises a first conversion stage and a second conversion stage. The first conversion stage comprises a first processing unit and a second processing unit. The first processing unit generates a first analog value and a first digital code according to the analog input signal. The second processing unit generates a second analog value and a second digital code according to first analog value. The first and the second processing units share an operational amplifier. The second conversion stage comprises a comparing unit. The first processing unit generates a third analog value and a third digital code according to the second analog value. The second processing unit generates a fourth analog value and a fourth digital code according to the third analog value. The second conversion stage generates a fifth digital code according to the fourth analog value. The comparing unit determines the second analog value and resets the operational amplifier according to the determined result.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
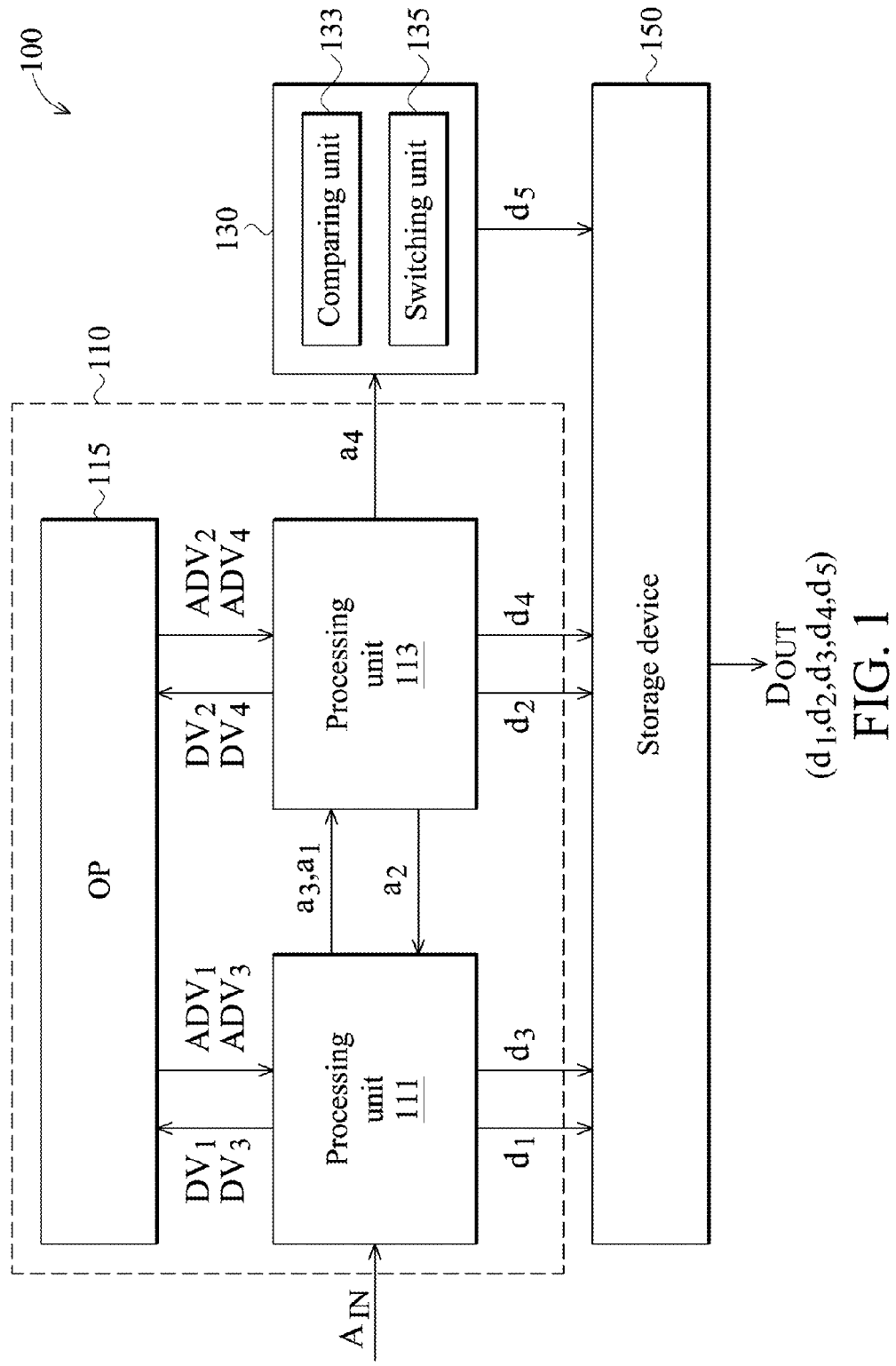
FIG. 1 is a schematic diagram of an exemplary embodiment of a pipelined ADC of the invention.

FIG. 1 is a schematic diagram of an exemplary embodiment of a pipelined ADC of the invention. The pipelined ADC 100 converts an analog input signal $A_{IN}$ into a digital output signal $D_{OUT}$. In one embodiment, the analog input signal $A_{IN}$ relates to brightness of light. In another embodiment, the pipelined ADC 100 comprises conversion stages 110, 130 and a storage device 150. In this embodiment, the pipelined ADC 100 comprises two conversion stages, but the disclosure is not limited thereto. The invention does not limit the number of conversion stages. In other embodiments, the number of the conversion stages may be 2 or more.

In this embodiment, the conversion stage 110 comprises processing units 111, 113 and an operational amplifier (OP) 115. In one embodiment, the processing unit 111 generates a digital code (e.g. $d_1$) according to the analog input signal $A_{IN}$. The digital code $d_1$ is stored in the storage unit 150. Then, the processing unit 111 converts the digital code $d_1$ into a first analog value and obtains a first difference (e.g. $DV_1$) between the analog input signal $A_{IN}$ and the first analog value. The first difference is transmitted to the OP 115. The OP 115 amplifies the first difference and provides an amplified result (e.g. $ADV_1$) to the processing unit 111. In this embodiment, the processing unit 111 samples and holds the amplified result (e.g. $ADV_1$) and transmits a sampled and held result (e.g. $a_1$) to the processing unit 113.

The processing unit 113 generates a digital code (e.g. $d_2$) according to the sampled and held result (e.g. $a_1$). The digital code $d_2$ is stored in the storage unit 150. Then, the processing unit 113 converts the digital code $d_2$ into a second analog value and obtains a second difference (e.g. $DV_2$) between the sampled and held result $a_1$ and the second analog value. The second difference is transmitted to the OP 115. The OP 115 amplifies the second difference and provides an amplified result (e.g. $ADV_2$) to the processing unit 113. In this embodiment, the processing unit 113 samples and holds the amplified result (e.g. $ADV_2$) and transmits a sampled and held result (e.g. $a_2$) to the processing unit 111.

The processing unit 111 generates a digital code (e.g. $d_3$) according to the sampled and held result (e.g. $a_2$). The digital code $d_3$ is transmitted to the storage unit 150. Then, the processing unit 111 converts the digital code $d_3$ into a third analog value and obtains a third difference (e.g. $DV_3$) between the sampled and held result $a_2$ and the third analog value. The third difference is transmitted to the OP 115. The OP 115 amplifies the third difference and provides an amplified result (e.g. $ADV_3$) to the processing unit 111. In this embodiment, the processing unit 111 samples and holds the amplified result (e.g. $ADV_3$) and transmits a sampled and held result (e.g. $a_3$) to the processing unit 113.

The processing unit 113 generates a digital code (e.g. $d_4$) according to the sampled and held result (e.g. $a_3$). The digital code $d_4$ is transmitted to the storage unit 150. Then, the processing unit 113 converts the digital code $d_4$ into a fourth analog value and obtains a fourth difference (e.g. $DV_4$) between the sampled and held result $a_3$ and the fourth analog value. The fourth difference is transmitted to the OP 115. The OP 115 amplifies the fourth difference and provides an amplified result (e.g. $ADV_4$) to the processing unit 113. In this embodiment, the processing unit 113 samples and holds the amplified result (e.g. $ADV_4$) and transmits a sampled and held result (e.g. $a_4$) to the conversion stage 130.

The conversion stage 130 generates a digital code (e.g. $d_5$) according to the sampled and held result (e.g. $a_4$). The digital code $d_5$ is transmitted to the storage unit 150. The storage unit 150 combines the digital codes $d_1$~$d_5$ into the digital output signal $D_{OUT}$. The digital output signal $D_{OUT}$ represents a digital code with N bits.

In this embodiment, the processing units 111 and 113 share the OP 115 to reduce power consumption. Since the processing units 111 and 113 share the OP 115 and execute a number of conversion operations, the pipelined ADC 100 has a sharing OP function and a recycle function. The conversion operation may comprise a digital-to-analog conversion procedure, an analog-to-digital conversion procedure and a sample/hold procedure, but the disclosure is not limited thereto.

In this embodiment, the conversion stage 130 comprises a comparing unit 133 and a switching unit 135. The comparing unit 133 determines whether one of the signals $a_1$~$a_4$ is located within a predetermined range. In this embodiment, the comparing unit 133 determines the signal $a_2$, but is not limited.

If the signal $a_2$ is not located within a predetermined range, the comparing unit 133 generates an enable signal such that the digital codes of the digital output signal $D_{OUT}$ output from the storage device 150 are set 0 or 1. At this time, the conversion stage 110 stops generate the digital codes $d_3$ and $d_4$. Since the conversion stage 110 is not required to execute the conversion operation, the power consumption of the pipelined ADC 100 is reduced.

In another embodiment, if one of the signals $a_1$~$a_4$ is not located within a predetermined range, the comparing unit 131 outputs a reset pulse to reset the offset of the OP 115 and avoid a memory effect issue.

In this embodiment, the conversion stage 110 executes a conversion operation, and simultaneously, the comparing unit 133 of the conversion stage 130 is idle. Thus, the comparing unit 133 is utilized to execute a determining procedure, but the disclosure is not limited thereto.

The switching unit 135 selectively transmits signal to the comparing unit 133. When the comparing unit 133 is required to execute the conversion operation, the switching unit 135 transmits the output signal of the conversion stage 110 to the comparing unit 133. If the comparing unit 133 is idle, the switching unit 135 transmits one of the signals $a_1$~$a_4$ to the comparing unit 133 to execute the determining procedure. In one embodiment the switching unit 135 is coupled between the processing unit 111 or 113 and the comparing unit 133 to selectively transmit one of the signals $a_1$~$a_4$ to the comparing unit 133. Additionally, the comparing unit 133 executes the determining procedure before the processing unit 111 receives a next analog input signal.

Figure 2:
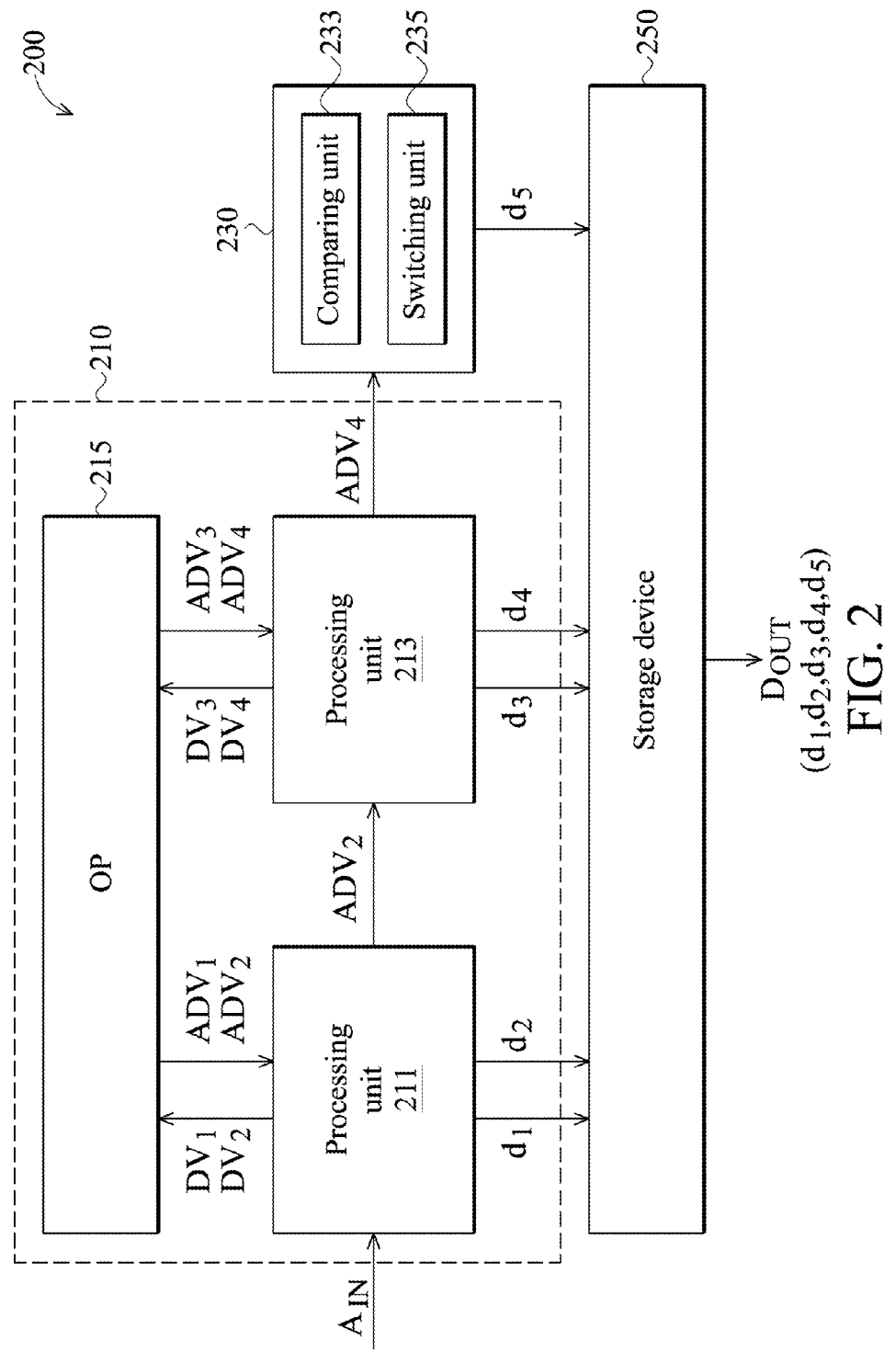
FIG. 2 is a schematic diagram of another exemplary embodiment of a pipelined ADC of the invention.

FIG. 2 is a schematic diagram of another exemplary embodiment of a pipelined ADC of the invention. FIG. 2 is similar to FIG. 1 except for the sequence of executing the conversion operation. In FIG. 1, the processing unit 111 executes once conversion operation, then the processing unit 113 executes once conversion operation, then the processing unit 111 executes once conversion operation, and then the processing unit 113 executes once conversion operation. In this embodiment, the processing unit 211 repeatedly executes the conversion operation and then the processing unit 213 repeatedly executes the conversion operation. For example, the processing unit 211 executes twice conversion operations and then the processing unit 213 executes twice conversion operations.

In this embodiment, the processing unit 211 samples and holds an analog signal $A_{IN}$ and generates a digital code (e.g. $d_1$) according to the sampled/held result. The digital code $d_1$ is stored in the storage device 250. Next, the processing unit 211 converts the digital code $d_1$ into a first analog value and then obtains a first difference (e.g. $DV_1$) between the analog signal $A_{IN}$ and the first analog value. The first difference (e.g. $DV_1$) is transmitted to the OP 215. The OP 215 amplifies the first difference (e.g. $DV_1$) and provides an amplified result (e.g. $ADV_1$) to the processing unit 211.

The processing unit 211 samples and holds the amplified result (e.g. $ADV_1$) and generates a digital code (e.g. $d_2$) according to the sampled/held result. The digital code $d_2$ is stored in the storage device 250. Next, the processing unit 211 converts the digital code $d_2$ into a second analog value and then obtains a second difference (e.g. $DV_2$) between the signal $ADV_1$ and the second analog value. The second difference (e.g. $DV_2$) is transmitted to the OP 215. The OP 215 amplifies the second difference (e.g. $DV_2$) and provides an amplified result (e.g. $ADV_2$) to the processing unit 211. The processing unit 211 transmits the amplified result (e.g. $ADV_2$) to the processing unit 213.

The processing unit 213 samples and holds the amplified result (e.g. $ADV_2$) and generates a digital code (e.g. $d_3$) according to the sampled/held result. The digital code $d_3$ is stored in the storage device 250. Next, the processing unit 213 converts the digital code $d_3$ into a third analog value and then obtains a third difference (e.g. $DV_3$) between the signal $ADV_2$ and the third analog value. The third difference (e.g. $DV_3$) is transmitted to the OP 215. The OP 215 amplifies the third difference (e.g. $DV_3$) and provides an amplified result (e.g. $ADV_3$) to the processing unit 213.

The processing unit 213 samples and holds the amplified result (e.g. $ADV_3$) and generates a digital code (e.g. $d_4$) according to the sampled/held result. The digital code $d_4$ is stored in the storage device 250. Next, the processing unit 213 converts the digital code $d_4$ into a fourth analog value and then obtains a fourth difference (e.g. $DV_4$) between the signal $ADV_3$ and the fourth analog value. The fourth difference (e.g. $DV_4$) is transmitted to the OP 215. The OP 215 amplifies the fourth difference (e.g. $DV_4$) and provides an amplified result (e.g. $ADV_4$) to the processing unit 213. The processing unit 213 transmits the amplified result (e.g. $ADV_4$) to the conversion stage 230.

The conversion stage 230 samples and holds the amplified result (e.g. $ADV_4$) and generates a digital code (e.g. $d_5$) according to the sampled/held result. The digital code $d_5$ is stored in the storage device 250. The storage unit 250 combines the digital codes $d_1$~$d_5$ into the digital output signal $D_{OUT}$. The digital output signal $D_{OUT}$ represents a digital code with N bits.

In this embodiment, the comparing unit 233 of the conversion stage 230 is utilized to determine whether one of the signals $ADV_1$~$ADV_4$ is located within a predetermined range. In this embodiment, the comparing unit 233 determines whether the signal $ADV_2$ is located within a predetermined range. At this time, the signals $ADV_3$ and $ADV_4$ are not generated. If the comparing unit 233 determines that the signal $ADV_2$ is not located within a predetermined range, the digital codes output from the storage unit 250 are set into 0 or 1.

For example, if the signal $ADV_2$ is higher than a maximum of the predetermined range, the digital codes output from the storage unit 250 are set into 1. If the signal $ADV_2$ is less than a minimum of the predetermined range, the digital codes output from the storage unit 250 are set into 0.

Additionally, the comparing unit 233 selectively resets the OP 215 according to the determined result. In one embodiment, the comparing unit 233 resets the OP 215 when one of the signals $ADV_1 \sim ADV_4$ is not located within a predetermined range.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pipelined recycling analog-to-digital converter (ADC), converting a first analog input signal into a first digital output signal, comprising:
    a first conversion stage comprising:
        a first processing unit executing a number of conversion operations, wherein for each conversion operation, the first processing unit generates an analog value and a digital code; and
        a second processing unit executing a number of conversion operations, wherein the first and the second processing units share an operational amplifier, and for each conversion operation, the second processing unit generates an analog value and a digital code; and
    a second conversion stage comprising a comparing unit which determines a specific analog value among the analog values generated by the first and the second processing units, wherein when the specific analog value is not located within a predetermined range, the comparing unit generates a reset pulse to reset the operational amplifier.

2. The pipelined recycling ADC as claimed in claim 1, wherein the first processing unit repeatedly executes the conversion operation and then the second processing unit repeatedly executes the conversion operation.

3. The pipelined recycling ADC as claimed in claim 1, wherein the first processing unit first executes the conversion operation to generate a first digital code and a first analog value according to the first analog input signal, and then the second processing unit executes the conversion operation to generate a second digital code and a second analog value according to the first analog value, and then the first processing unit again executes the conversion operation to generate a third digital code and a third analog value according to the second analog value, and then the second processing unit again executes the conversion operation to generate a fourth digital code and a fourth analog value according to the third analog value and then the second conversion stage executes the conversion operation to generate a fifth digital code.

4. The pipelined recycling ADC as claimed in claim 3, wherein when the second analog value is not located within the predetermined range, the first and the second processing units stops executing the conversion operation.

5. The pipelined recycling ADC as claimed in claim 4, wherein when the second analog value is higher than a maximum value of the predetermined range, the third, the fourth and the fifth digital codes are set to 1.

6. The pipelined recycling ADC as claimed in claim 4, wherein when the second analog value is less than a minimum value of the predetermined range, the third, the fourth and the fifth digital codes are set to 0.

7. The pipelined recycling ADC as claimed in claim 1, wherein the first analog input signal relates to brightness of light.

8. The pipelined recycling ADC as claimed in claim 1, wherein after generating the first digital output signal, the pipelined recycling ADC converts a second analog input signal into a second digital output signal, and
    wherein before the pipelined recycling ADC receives the second analog input signal, the comparing unit determines the specific analog value and resets the operational amplifier according to the determined result.

9. The pipelined recycling ADC as claimed in claim 1, wherein in a conversion mode, the comparing unit executes a procedure relating to the conversion operation and in an idle mode, the comparing unit executes a determining procedure, which does not relate to the conversion operation.

10. The pipelined recycling ADC as claimed in claim 9, wherein the comparing unit determines whether the specific analog value is located within the predetermined range in the idle mode.

11. A pipelined recycling ADC, converting an analog input signal into a digital output signal, comprising:
    a first conversion stage comprising:
        a first processing unit generating a first analog value and a first digital code according to the analog input signal; and
        a second processing unit generating a second analog value and a second digital code according to first analog value, wherein the first and the second processing units share an operational amplifier; and
    a second conversion stage comprising a comparing unit,
    wherein the first processing unit generates a third analog value and a third digital code according to the second analog value,
    wherein the second processing unit generates a fourth analog value and a fourth digital code according to the third analog value,
    wherein the second conversion stage generates a fifth digital code according to the fourth analog value, and
    wherein the comparing unit determines the second analog value and resets the operational amplifier according to the determined result.

12. The pipelined recycling ADC as claimed in claim 11, wherein the first processing unit receives the second analog value, meanwhile, the comparing unit determines the second analog value and resets the operation amplifier according to the determined result.

13. The pipelined recycling ADC as claimed in claim 11, wherein when the second analog value is not within a predetermined range, the comparing unit generates a rest pulse to reset the operational amplifier.

14. The pipelined recycling ADC as claimed in claim 11, wherein when the second analog value exceeds a maximum value of the predetermined range, the third, the fourth and the fifth digital codes are set to 1.

15. The pipelined recycling ADC as claimed in claim 11, wherein when the second analog value is less than a minimum value of the predetermined range, the third, the fourth and the fifth digital codes are set to 0.

* * * * *